US00RE44116E

(19) United States
(12) Reissued Patent
True et al.

(10) Patent Number: US RE44,116 E
(45) Date of Reissued Patent: Apr. 2, 2013

(54) SUBSTRATE-ALIGNMENT USING DETECTOR OF SUBSTRATE MATERIAL

(75) Inventors: Emily True, San Ramon, CA (US); Ray Ellis, Aptos, CA (US); Shiyu Zhang, Hayward, CA (US)

(73) Assignee: Ultratech, Inc., San Jose, CA (US)

(21) Appl. No.: 13/366,199

(22) Filed: Feb. 3, 2012

Related U.S. Patent Documents

Reissue of:
(64) Patent No.: 7,751,067
Issued: Jul. 6, 2010
Appl. No.: 11/805,826
Filed: May 24, 2007

(51) Int. Cl.
*G01B 11/14* (2006.01)
*G01B 11/00* (2006.01)

(52) U.S. Cl. ..... 356/614; 356/399; 356/400

(58) Field of Classification Search ..... 356/614, 356/625, 399–401; 250/548; 355/53, 55, 355/72, 77; 430/5, 22, 30; 438/14, 16, 401, 438/720

See application file for complete search history.

(56) References Cited

U.S. PATENT DOCUMENTS

| | | | | |
|---|---|---|---|---|
| 4,566,086 | A * | 1/1986 | Anderson | 369/13.01 |
| 4,599,000 | A * | 7/1986 | Yamada | 356/401 |
| 5,929,997 | A | 7/1999 | Lin | |
| 5,985,764 | A | 11/1999 | Lin et al. | |
| 6,525,805 | B2 | 2/2003 | Heinle | |
| 6,866,969 | B2 * | 3/2005 | Miyamae et al. | 430/5 |
| 6,985,229 | B2 * | 1/2006 | Lee et al. | 356/401 |
| 7,064,807 | B2 * | 6/2006 | Gui et al. | 355/67 |
| 7,095,438 | B2 * | 8/2006 | Hayashi | 348/237 |
| 7,113,258 | B2 * | 9/2006 | Van Buel et al. | 355/53 |
| 7,253,884 | B2 * | 8/2007 | Van Buel et al. | 355/77 |
| 7,420,676 | B2 * | 9/2008 | Lof et al. | 356/401 |
| 7,433,038 | B2 * | 10/2008 | Bijnen et al. | 356/400 |
| 2005/0059255 | A1 * | 3/2005 | Varnerin et al. | 438/720 |
| 2006/0115956 | A1 * | 6/2006 | Raval et al. | 438/401 |

* cited by examiner

*Primary Examiner* — Sang Nguyen
(74) *Attorney, Agent, or Firm* — Allston L. Jones; Peters Verny, LLP

(57) ABSTRACT

Methods and apparatuses are provided for positioning a substrate having a target that may be located on either the frontside or the backside of the substrate. The optical detector that views the target contains a signal-generating material that is substantially identical to the substrate material.

65 Claims, 6 Drawing Sheets

SUBSTRATE-ALIGNMENT USING DETECTOR OF SUBSTRATE MATERIAL

Matter enclosed in heavy brackets [ ] appears in the original patent but forms no part of this reissue specification; matter printed in italics indicates the additions made by reissue.

BACKGROUND

1. Field of the Invention

The present invention pertains to substrate-positioning methods and apparatuses. In particular, the invention relates to apparatuses and methods for positioning substrates in lithography systems that use optical detectors employing a signal-generating material that is substantially identical in composition to that of the substrate.

2. Background Art

Semiconductor device manufacturing processes typically require multiple uses of a lithographic apparatus to expose a substrate, e.g., a semiconductor wafer coated with photosensitive material, to a pattern contained on a reticle or mask. This exposure requires proper alignment of the previously exposed patterns on the substrate, to the new mask pattern projected on to the substrate. Proper positioning is achieved by moving the substrate holder or chuck with a stage. After alignment, the reticle may be flooded with radiation causing the mask pattern to be projected onto the photosensitive coating on the wafer surface. After development the photoresist pattern is transferred to an underlying layer of material by etching, thereby forming a device layer. Successive device layers may be formed through variations of similar exposure techniques.

Typically, semiconductor device processes require wafer and/or layer alignment. Such alignment may be carried out using a feature on the wafer, for example, an alignment mark, or a circuit feature that is easily distinguished from the adjacent circuit features. Exemplary alignment marks include chevrons, squares, crosses and grouped lines with various orientations.

Certain lithographic applications may be used to produce a three-dimensional structure that extends from a first side through to a second side of the substrate. In such cases, the substrate may be processed on one side, and then flipped over and processed on the opposite side to create the desired three-dimensional structure. Accordingly, to ensure that the connections between the features on the opposing sides are properly made, it is necessary to have some means for aligning a mask pattern to be printed on one side to an alignment feature on the opposing side.

One exemplary lithographic application requiring dual-side alignment involves the micromachining of substrates in the production of pressure transducers. Another exemplary application involves the production of optical sensors. In both cases, it may be desirable to form a conductive via running through the substrate from one side to the other to provide electrical communication therebetween. Accordingly, such lithographic applications require a dual-side alignment capability so that good electrical connections between the front and back-side electrical components may be established. A number of different approaches have been attempted to effect dual-side wafer alignment. In general, these approaches require viewing the backside of a wafer directly rather than viewing it through the substrate thickness. As used herein (unless the context clearly indicates to the contrary), the term "backside" refers to the side of the wafer that is typically in contact with the chuck and opposite the so-called "frontside," which may be coated with a resist layer that receives the mask pattern.

As another example, U.S. Pat. No. 5,985,764 describes a technique for viewing alignment marks from the backside of a substrate by coating the alignment marks on the frontside of the substrate with an IR-reflective coating. This technique is used to overcome the topography of overlying layers, which would otherwise obscure the appearance of the alignment marks. Unfortunately, the technique requires the use of a specialized IR transparent stage and an otherwise unnecessary IR-reflective coating. As a result, the technique is a relatively complex and expensive approach for alignment marks viewing.

As a further example, U.S. Pat. No. 5,929,997 describes a method for aligning a reticle pattern with a patterned semiconductor wafer that includes simultaneous viewing of the alignment keys on a reticle and alignment targets on the backside of a wafer through the chuck supporting the wafer. However, the method is fairly complex in that the alignment light must pass through the reticle as well as through the wafer.

As a still further example, U.S. Pat. No. 6,525,805 describes an apparatus that includes a movable chuck that can position one end of an optical system to view either the frontside or backside of a substrate. This may be done for example, by placing the end adjacent the frontside of the substrate or near the frontside but outside the perimeter of the substrate. Such an arrangement allows for the optical system to be placed in optical communication with a second optical system to allow for the imaging of alignment marks on the backside onto a detector.

Accordingly, there is a need for a simpler alignment system that can image one or more alignment marks and/or features on either side of a substrate to provide for quick, precise, and inexpensive substrate positioning, alignment and processing.

SUMMARY OF THE INVENTION

In a first aspect, the invention provides a method for positioning a substrate. The method involves holding a substrate that has a first surface and a reflective alignment feature. The feature is located at a position that is separated from the first surface by a first layer of material. The material has at least partial transparency to light of a selected wavelength. Light of the selected wavelength is directed toward the reflective feature. In turn, the alignment feature reflects light directed thereto and is intercepted by an optical detector. Typically, the optical detector includes a signal-generating material that is substantially identical in composition to the first layer material. For example, the materials may both include, or consist essentially of, silicon. The intercepted light causes the detector to generate a sufficiently analyzable signal to allow a signal-analyzing system to locate the position of the feature with a degree of precision sufficient for substrate alignment.

The optical path of the light may vary. Typically, light is transmitted through the first substrate surface and the first layer and is reflected back through the first layer and the first surface toward the optical detector. In the alternative, light may not be transmitted through the first surface and/or the first layer.

A number of optical detectors may be used. For example, the optical detector may be an image detector and the signal-analyzing system a machine-vision system capable of recognizing the alignment feature from the detector signal. Feature recognition typically involves distinguishing the alignment feature from other nearby circuit features. In such a case, the signal may exhibit a signal-to-background ratio and a signal-to-noise ratio that is sufficient to obtain a position accuracy of less than ±0.5 micrometers. In the absence of other features, the signal may, additionally or in the alternative, exhibit a signal-to-noise ratio of at least 3:1.

Light of various wavelengths may be used. For example, light of an infrared wavelength, e.g., about 0.8 μm to about 1.1 μm may be used. In some instances, substantially monochromatic light, light of a selected wavelength contained in a spectral bandwidth of less than about 10 nm, may be used.

Reflective features, substrate materials, and other aspects of the substrate may vary as well. For example, the substrate may be a precursor to a light detector or image detector. The first layer may have a thickness of about 50 micrometers to about 200 micrometers, and the reflective feature may be located at a second surface that opposes the first surface.

In some instances, a substrate may include a second layer. In such a case, the reflective alignment feature may be interposed between the first and second layers. The first and second layers may include different materials. Optionally, one of the first and second layers may be thicker than the other.

In another aspect, a method is provided for locating a boundary of a reflective alignment feature of a substrate. The method may involve holding a substrate having a first surface and a reflective feature that is at least defined in part by a boundary. The image detector may be used to intercept light reflected from the alignment feature to generate a signal with characteristics permitting a machine vision system to locate the boundary positions of the feature to a precision less than ±0.5 micrometers.

In a further aspect, an apparatus is provided for aligning a substrate. The apparatus includes a substrate as described above held by a substrate holder. Also included is a light source for generating light of the selected wavelength. The light source is positioned to direct light of the selected wavelength to the alignment feature, which may require it to pass through the first surface and the first layer. Further provided is an image detector as described above positioned to intercept light reflected from the alignment feature. Upon receiving the reflected light, the detector generates a signal that allows a machine vision system in signal-receiving relation to the image detector to recognize the reflective feature. The system may also determine from the signal the position of the reflective feature with a degree of precision sufficient for substrate alignment.

The apparatus may have the capability to determine the position of the reflective alignment feature to a precision described above as well as carrying out other variations or aspects of the above-described methods. For example, the light source may generate light of a selected wavelength that produces an image having sufficient contrast relative to the region adjacent the reflective alignment feature that the alignment feature may be correctly distinguished from other features and located with sufficient accuracy for alignment.

BRIEF DESCRIPTION OF THE DRAWINGS

FIG. 1A shows a blank silicon wafer held in a chuck. FIG. 1B shows a wafer that has been patterned so that it contains a reflective feature covered by a glass plate. FIG. 1C depicts an optimal result of the dual-side technique in the form of a wafer having front-side and backside features in alignment. FIG. 1D depicts a suboptimal result of the technique.

FIG. 6A shows images formed from two different substrates using the transmissive front view approach. FIG. 6B shows images formed from the same two substrates using the reflective back view approach.

Figure 1A:
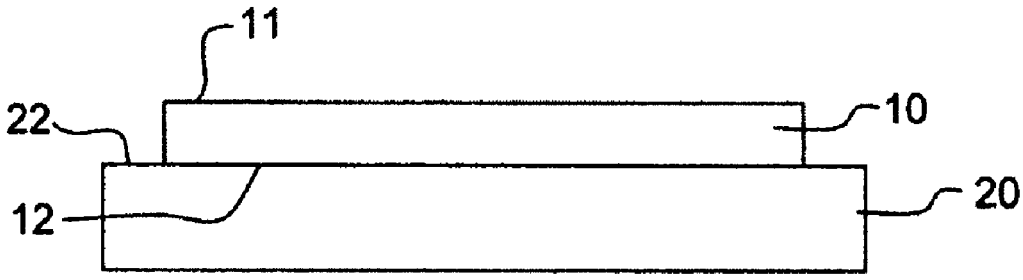
FIGS. 1A-1D, collectively referred to as FIG. 1, schematically depict an apparatus that may be used to carry out an exemplary dual-side semiconductor processing technique.

The drawings are intended to illustrate various aspects of the invention, to do so they may not be to scale as certain features of the drawings may be exaggerated or omitted for emphasis and/or clarity of presentation.

DETAILED DESCRIPTION OF THE INVENTION

Definitions and Overview

Before describing the present invention in detail, it is to be understood that this invention, unless otherwise noted, is not limited to specific substrates or materials, all of which may vary. It is also to be understood that the terminology used herein is for the purpose of describing particular embodiments only and is not intended to be limiting.

As used in this specification and the appended claims, the singular forms "a," "an," and "the" include both singular and plural referents unless the context clearly dictates otherwise. Thus, for example, reference to "a feature" includes a plurality of features as well as a single feature, reference to "a layer" includes a laminate of layers as well as a single layer, and the like.

Furthermore, terminology indicative or suggestive of a particular spatial relationship between elements of the invention is to be construed in a flexible rather than a rigid manner unless the context of usage clearly dictates to the contrary. For example, the terms "over" and "on" as used to describe the spatial orientation of a second item relative to a first item does not necessarily indicate that the second item is located above the first item. Thus, in a substrate that includes a second layer placed on a first layer, the second layer may be located above, at the same level as, or below the first layer depending on the substrate's orientation. Similarly, a "first-side surface" of a substrate may lie above, at the same level as, or below other portions of the substrate, e.g., a "second-side surface", depending on the orientation of the substrate. In an ordinary photolithographic semiconductor processing context using projection and alignment systems, however, it is the "top" surface of a substrate that faces the projection and alignment systems while the "bottom" surface faces the chuck.

In describing and claiming the present invention, the following terminology is used in accordance with the following definitions, unless the context in which they are employed clearly indicates otherwise.

The term "semiconductor" is used to refer to any of various solid substances having electrical conductivity greater than insulators but less than good conductors, and that may be used as a base material for computer chips and other electronic devices. Semiconductors may be comprised substantially of, or consist essentially of, a single element, e.g., silicon or germanium, or may be comprised of, or consist essentially of, chemical compounds such as silicon carbide, aluminum phosphide, gallium arsenide, and indium antimonide. Microstructures of semiconductors may be single crystal, polycrystalline, or amorphous.

Unless otherwise noted, the term "semiconductor" includes any one or a combination of elemental and compound semiconductors, strained semiconductors, e.g., semiconductors under tension and/or compression, and semiconductors of varying levels of order, e.g., single crystal, polycrystalline, or amorphous. Exemplary indirect bandgap semiconductors suitable for use with the invention include Si, Ge, and SiC. Direct bandgap semiconductors suitable for use with the invention include, for example, GaAs, GaN, and InP.

The terms "substantial" and "substantially" are used in their ordinary sense and refer to matters that are considerable in importance, value, degree, amount, extent or the like. For example, the phrase "substantially identical in composition" as used to describe different items indicates that the items differ in composition by at most only a trivial degree. Other uses of the term "substantially" involve an analogous definition.

The term "substrate" as used herein refers to any material having a surface, which is intended for processing, e.g., a supporting material on which a circuit may be formed or fabricated. The substrate may be constructed in any of a number of forms, for example, such as a semiconductor wafer containing an array of chips, etc., and/or may comprise one or more non-semiconductor materials as well as one or more semiconductor materials.

As a related matter, the term "wafer" as used herein refers generally to a thin slice of semiconductor material used as a base material on which single transistors or integrated-circuit components are formed. The terms "wafer" and "substrate" may be interchangeably used herein unless the context clearly indicates to the contrary.

In general, the invention relates to a substrate positioning and/or aligning method that may be used with alignment targets located on either side of the substrate. Typically, such techniques involve a silicon wafer having opposing and substantially parallel surfaces that contain interconnected components. A wafer holder, e.g., a chuck, may be used to hold the wafer so that both surfaces are horizontally oriented and the upper surface may be photolithographically patterned to form device structures on a first surface. The wafer may then be processed through a lithography stepper with the first surface of the wafer facing down to produce features on the second surface of the wafer in alignment with the first surface device structures. Typically, an optical viewing arrangement is used whereby the radiation used to illuminate a target alignment feature may pass through a portion of the substrate before reaching the detector.

FIG. 1 illustrates a part of an apparatus that may be used to carry out an exemplary dual-side semiconductor processing technique. As shown in FIG. 1A, a blank silicon wafer 10 having first and second substantially parallel and opposing surfaces, indicated at 11 and 12, respectively, is immobilized on a chuck 20 having an upper surface indicated at 22. Depending on the construction and processing history of the wafer, the wafer surfaces 11 and 12 may vary from planar to slightly warped in an unconstrained state. As shown, the wafer 10 is held so that surface 12 conforms to the profile of upper chuck surface 22, though this is not a requirement.

Figure 1B:
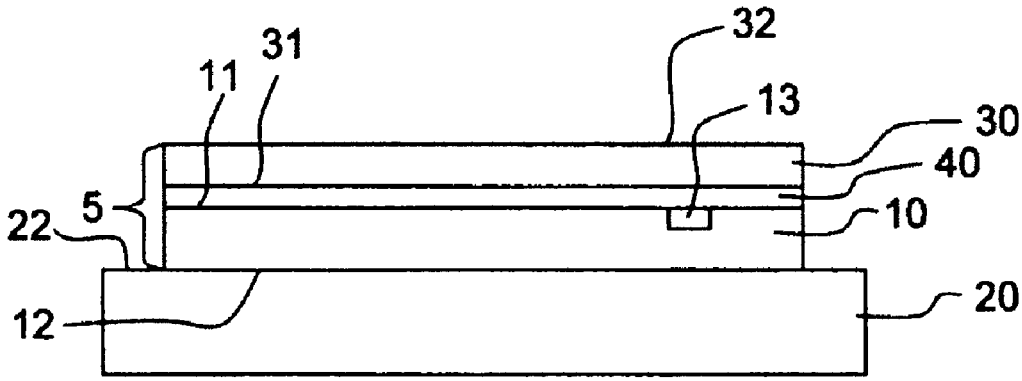

In FIG. 1B, the wafer 10 has been processed so that first-side feature 13 has been formed. A glass layer 30 having substantially planar, parallel, and opposing surfaces, indicated at 31 and 32, has been placed on and adhered to the wafer 10. First-side wafer surface 11 faces glass surface 31 with an adhesive layer 40 is interposed between the wafer 10 and the glass layer 30. As a result, an integrated substrate 5 is formed wherein the glass layer 30 is in position to protect the first-side surface 11 of the wafer 10 from mechanical damage.

Figure 1C:
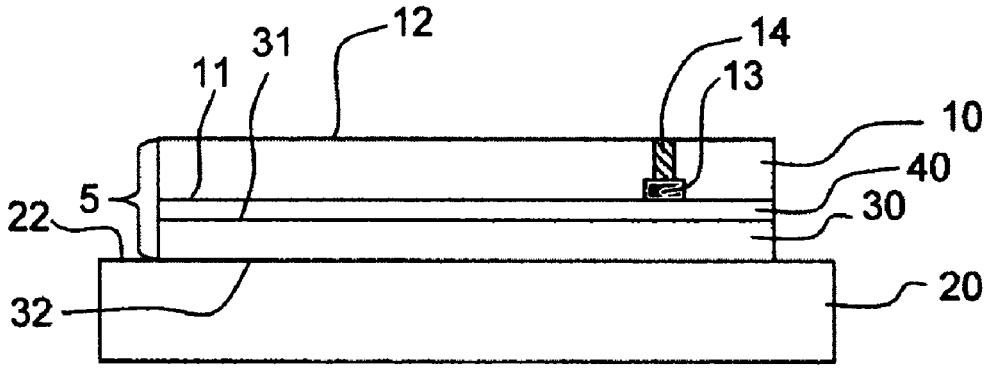
Figure 1D:
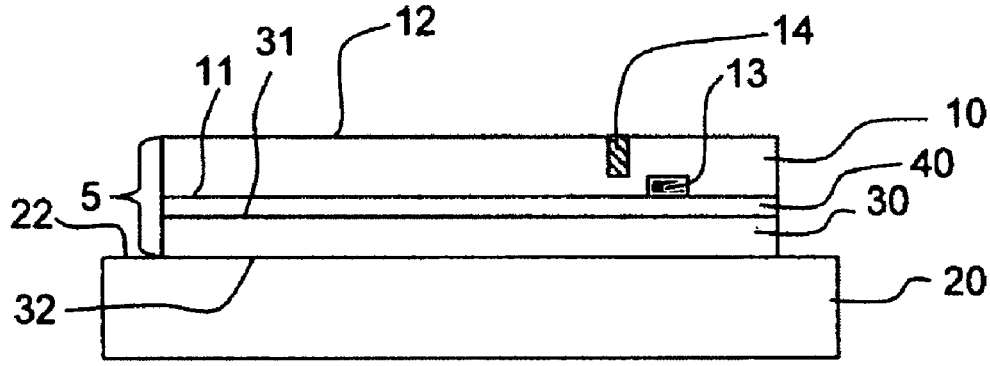

In FIGS. 1C and 1D, the substrate 5 is placed in chuck 20 so that glass surface 32 faces chuck surface 22. As compared to FIGS. 1A and 1B, the positions of second-side surface 12 and first-side surface 11 of the wafer 10 are thereby transposed, leaving second-side surface 12 of the wafer 10 positioned for exposure. For example, the second-side surface of the wafer may be processed to form one or more features, that, in combination with the first-side feature 13, constitute a microelectronic device.

To ensure device operability, the features on the second-side of the wafer may have to be aligned to an acceptable degree relative to the structure patterns in the first-side of the wafer. For example, first-side feature 13 may serve as an alignment target. With continued reference to FIG. 1C, second-side feature 14 is shown in electrical communication with first-side feature 13, and features 13 and 14 in combination represent an operative device or portion thereof. In contrast, FIG. 1D depicts an instance in which features 13 and 14 are misaligned. In such a case, no electrical communication would be established between feature 13 and 14, and an inoperative device would result. In short, certain devices have a construction that requires that the first-side-to-second-side feature overlay alignment to conform to a certain degree of precision for device operability.

A Reflective Back View Approach

The invention generally provides methods and apparatuses for positioning and/or aligning a substrate to avoid problems such as that depicted in FIG. 1D. For example, a substrate is provided having a first surface and a reflective feature on the first surface. The first surface is separated from a second surface of the substrate by a first layer of material. The material has at least partial transparency to light of a selected wavelength. Light of the selected wavelength is directed through the second substrate surface and the first layer toward the reflective feature. In turn, the feature reflects light directed thereto through the first layer and the second surface. As a result, an optical detector intercepts the reflected light. From the intercepted light, the detector may generate a sufficiently analyzable signal to allow a signal-analyzing system to locate the position of the feature with a degree of precision sufficient for substrate alignment.

Typically, the optical detector includes a signal-generating material that is substantially identical in composition to the first layer material. For example, the materials may both include, or consist essentially of, silicon. In some instances, the substrate may serve as a precursor another optical detector.

Figure 2:
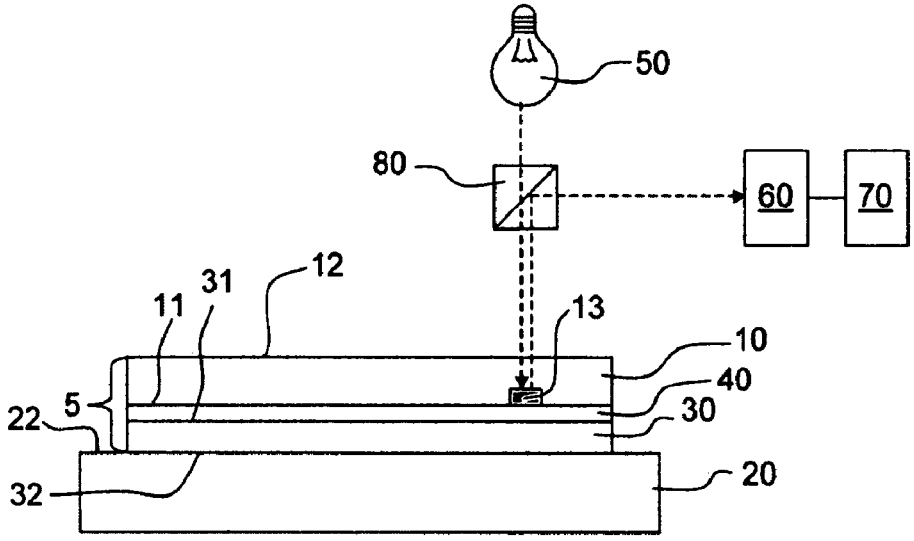
FIG. 2 is a simplified schematic cross-sectional representation of an exemplary embodiment of an alignment system of the present invention that employs a reflective target alignment feature on the back of the substrate as viewed through the front of the substrate to locate the alignment feature.

FIG. 2 depicts in simplified schematic view an exemplary apparatus of the invention suitable for carrying out the "reflective back view approach" encompassed by the invention. In FIG. 2, an apparatus is shown including a substrate 5 comprising a silicon wafer 10 and a glass layer 30 adhered to wafer surface 11 via adhesive 40. The wafer includes a feature 13 located in surface 11. The feature 13 has a reflectivity different from the adhesive layer 40 and the glass layer 30 and may serve as an alignment target. The substrate is immobilized on a chuck 20 so that the surface 32 of glass layer faces upper chuck surface 22. When an infrared light source 50 is activated, light is directed toward second-side surface 12 of the substrate 5 and through the wafer 10. Light reaching surface 11 is reflected by reflective feature 13 back through wafer 10 and surface 12 toward an optical detector 60. The optical detector 60 is in a signal-communicating relationship to a signal analyzing system 70.

Once the reflected light reaches the optical detector 60, a signal is generated. Because light reflects off feature 13 differently from that reflected from the adhesive layer 40 and/or the glass layer 30, the signal generated by the optical detector may analyzed by analyzing system 70 to locate the position of the feature 13. Preferably, the signal has a contrast sufficient for the analyzing system to locate the position of the feature to a precision sufficient for substrate alignment.

While the construction of the detector may vary, an important aspect of the invention involves the detector composition. In particular, it has unexpectedly been found that even when the detector uses a signal-generating material that is substantially identical in composition to the wafer material, a sufficiently analyzable signal may result for precise feature location.

Alternative Alignment Techniques

A number of alignment techniques are possible. However, the reflective back view approach provides improved performance over such techniques. The following provides a brief description of alternative approaches for substrate alignment and/or feature location aspects that are encompassed by the invention.

Figure 3:
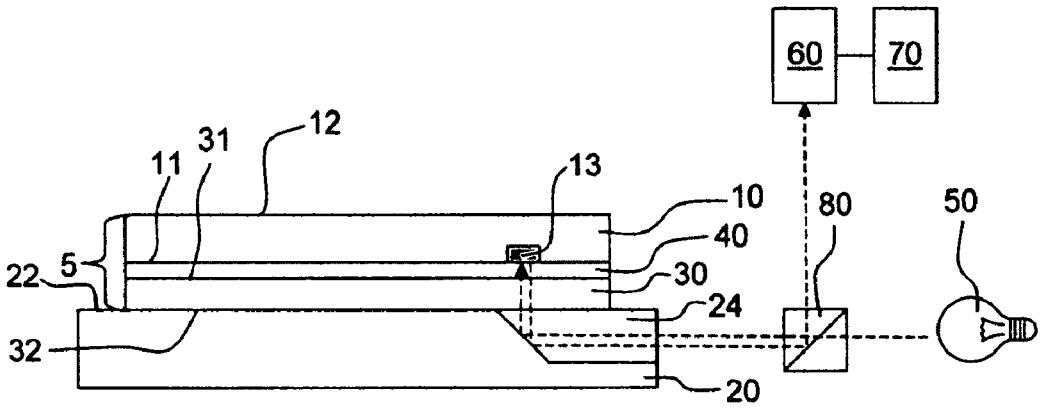
FIG. 3 is a simplified schematic cross-sectional representation of an alignment system that directly views a target alignment feature on the backside of a wafer through an access provided through the chuck.

FIG. 3 shows a direct view approach that requires access through wafer chuck 20. In FIG. 3, an apparatus is shown including a substrate 5 comprising a silicon wafer 10 and a glass layer 30 adhered to wafer surface 11 via adhesive 40. A feature 13 having a reflectivity different from the wafer-glass interface is located in surface 11. The substrate is immobilized on chuck 20, which has embedded therein an access path 24 through which light may be directed.

In operation, an incandescent visible light source 50 may direct light successively through the access path 24 in element 20, glass layer 30 and adhesive 40 to reach wafer 10 and reflective feature 13. In turn, light is reflected by feature 13 and returns back through adhesive 40, glass layer 30, and access path 24 to an optical detector 60. In such a case, feature 13 serves as an alignment target, and the detector 60 generates a signal, which, in turn, may be analyzed by the signal analyzing system 70 to identify and locate feature 13.

The approach depicted in FIG. 3 has a number of drawbacks. In general, the approach requires a high level of system complexity for subsystem alignment and calibration. For example, commercially available chucks typically are not readily adaptable to include the access path necessary to carry out this approach. In addition, the inclusion of optical elements in the chuck surface, such as folding mirrors may compromise the overall flatness of the substrate. Furthermore, this approach requires that the alignment targets be located in preset, fixed positions on the wafer and that the number of targets to be used for alignment be minimal in order to reduce the mechanical complexity.

Figure 4:
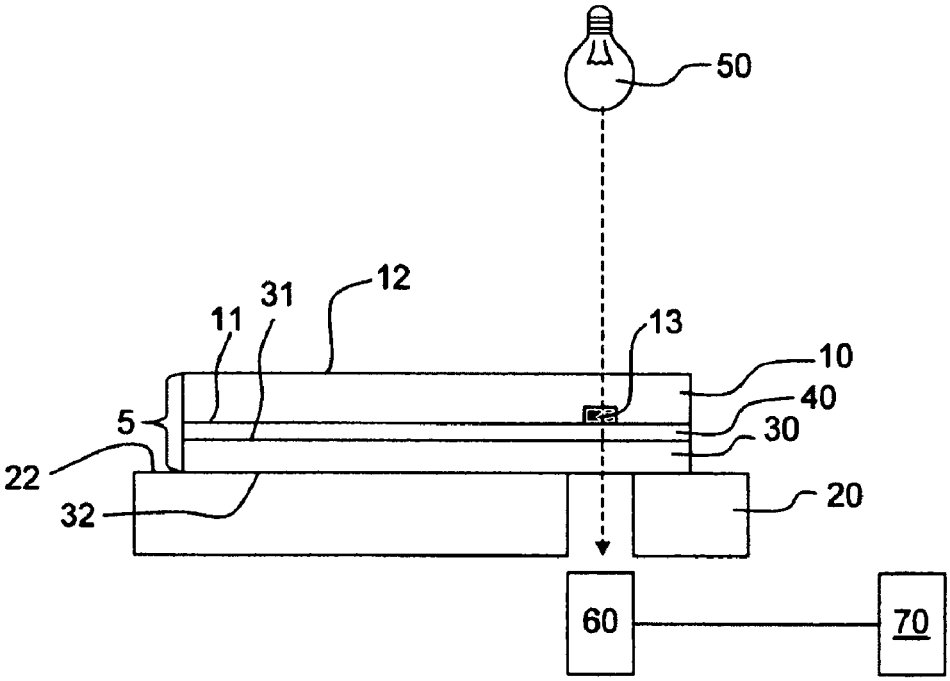
FIG. 4 is a simplified schematic cross-sectional representation of an alignment system, similar to that of FIG. 3, employing a light source that is transmitted through the substrate to the viewing system on the backside.

FIG. 4 depicts another alignment technique that also involves viewing the target directly with illumination transmitted through wafer 10. In FIG. 4, the apparatus shown is similar to that shown in FIG. 3. The substrate 5 includes a silicon wafer 10, a glass layer 30 adhered to wafer surface 11 via adhesive 40, and a feature 13 having a transmission different from that of the surrounding wafer 10 near surface 11. The substrate is immobilized on chuck 20, which, during alignment, is positioned so that an infrared light source 50 illuminates the alignment target area. Infrared detector 60 is placed to receive an image of surface 11 with the illumination transmitted through wafer 10.

In operation, the infrared light source may direct light successively through wafer 10, adhesive 40, and glass layer 30 to reach detector 60. Since feature 13 has a different transmissivity from that of the surrounding wafer, the transmitted light forms a contrasting image on detector 60 that corresponds to feature 13. For example, when the feature is more opaque than the wafer, the resulting image includes a shadow of the feature. In any case, the feature 13 serves as an alignment target, and the signal generated by detector 60 from the image, in turn, may be analyzed by the signal analyzing system 70 to identify and locate the position of feature 13.

The approach depicted in FIG. 4 also has a number of drawbacks similar to the drawbacks exhibited by the approach shown in FIG. 3. For example, this approach also requires a high level of system complexity for subsystem alignment and calibration. The alignment targets must be located in preset, fixed positions on the wafer and that the number of targets to be used for alignment needs be minimal to reduce the mechanical complexity. Commercially available chucks typically are not readily adaptable to include optical elements necessary to carry out this approach. In addition, this approach also requires that alignment be done only when the light source is appropriately aligned with the alignment target.

Comparison with Alternatives

It should be readily apparent from the above discussion that the inventive approach exhibits a number of advantages over the alternative approaches. For example, the inventive approach does not require a specialized chuck or substrate holder. In addition, with reference to FIG. 2, the optical properties of the glass layer 30 and the adhesive 40 do not represent a significant constraint on the practice of the invention. Furthermore, assuming that the wafer is substantially uniform with respect to the transmission of the light employed to illuminate the target and the light reflected from the wafer surface opposite that containing the target is not too bright in comparison, the invention provides for alignment target imagery with reasonable contrast.

Given the state of the art, however, the operability of the invention poses a number of challenges and tradeoffs. For example, the invention involves imaging of an alignment target using reflected light that has traveled through the thickness of the wafer twice—light that has traveled from the source through the wafer to the target, and from the target back through the wafer to the detector. In contrast, alternative approaches generally involve using light that has not traveled twice through the wafer. For example, the approach shown in FIG. 3 requires no light to travel through the wafer at all. In addition, the approach shown in FIG. 4 requires light to travel through the wafer only once. Thus, for example, questions relating to image contrast, signal-to-noise ratio, and/or target signal-to-background ratio must be positively resolved in order to provide target recognition and position location with sufficient precision for substrate alignment. Such questions are further complicated by the design and construction of light sources and optical detectors.

A number of light sources may be used with alignment technologies. Incandescent light sources generally provide a high output over a very wide spectral range, with their output degrading fairly quickly over time. In this particular application it is desirable to employ a light source with a relatively narrow spectrum and with a center wavelength optimally positioned to yield a high contrast image and a brightness compatible with an inexpensive, commercially available, solid-state, image detector.

In contrast to incandescent light sources, light emitting diodes (LED), are generally advantageous in that they efficiently provide a narrow band of radiation with good brightness. LEDs are compact in construction, inexpensive to operate, and easy to control. In addition, LEDs have a generally constant output over their long lifetime and are highly reliable. Different types of detectors may also be used with alignment technologies. For example, single-element detectors such as those based on silicon are generally inexpensive and readily available in different forms from numerous suppliers. In contrast, semiconductor detectors such as those based on indium and gallium arsenide are relatively expensive, generally have fewer pixels than their silicon counterparts, and the supplier base is limited.

Returning to questions such as those relating to image contrast, signal-to-noise ratio, and/or signal-to-background ratio for any particular system, it should be apparent that only certain combinations of light sources, detectors, substrates, geometries, materials, and other factors allow an apparatus to achieve substrate alignment to a desired accuracy. For example, experimental data confirm that image contrast is a particularly problematic issue. Tests were performed on different substrates using the set-up shown in FIG. 5 to compare the transmissive front view approach with the reflective back view approach.

Figure 5:
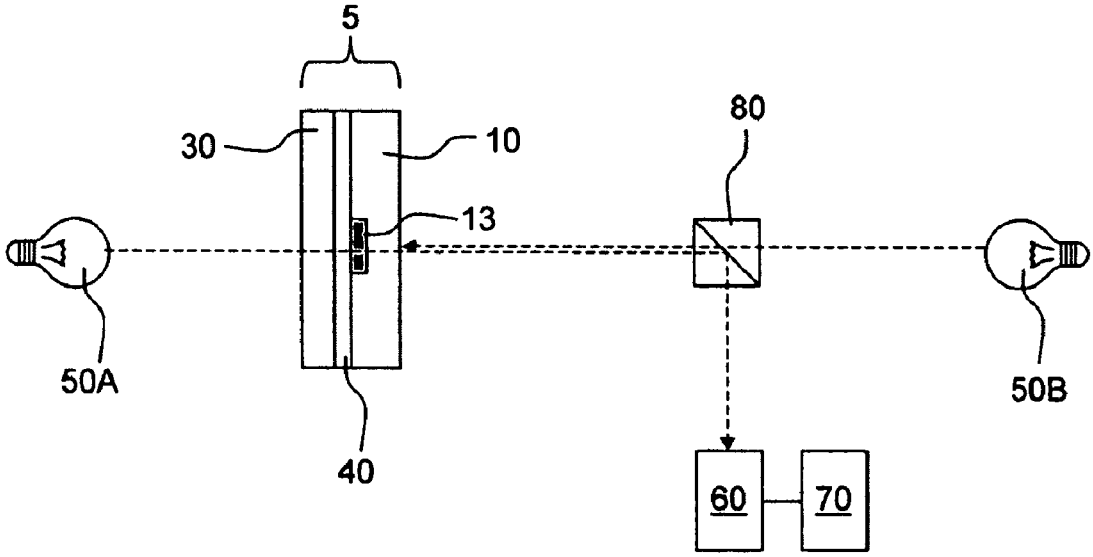
FIG. 5 schematically depicts in simplified view a test apparatus that was used on different substrates to determine the image contrast obtained as a result of the transmissive front view approach and the reflective back view approach.

In FIG. 5, the test substrates each included a silicon wafer 10, a glass layer 30 adhered to a wafer 10 via adhesive 40 with metallic target features 13 located in wafer 10 near adhesive 40. The test substrates 5 were held so that their first-side or second-side could be illuminated by substantially identical infrared light sources, i.e., first-side light source 50A or second-side source 50B.

When light source 50A was used, light was directed successively through glass layer 30, adhesive 40, and silicon wafer 10. The transmitted light was then redirected by beam-splitter 80 to reach a silicon-based detector 60. In contrast, when light source 50B was used, light was directed successively through beam-splitter 80 and silicon wafer 10 to reach alignment target feature 13. Then, reflected light traveled back through silicon wafer 10 and was redirected by beam-splitter 80 to reach the silicon-based detector 60.

Figure 6A:
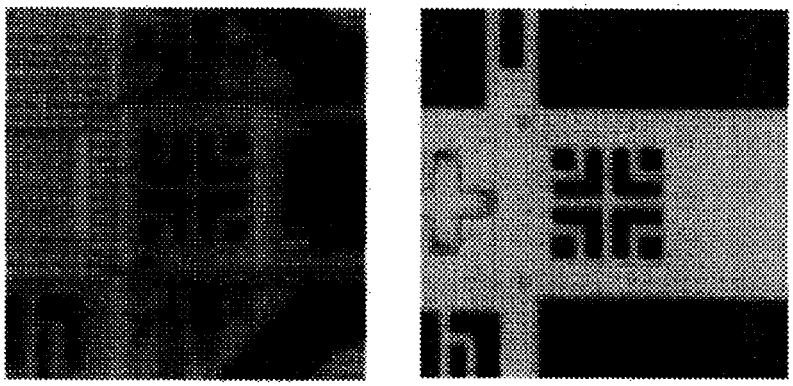
FIGS. 6A and 6B, collectively referred to as FIG. 6, are images formed from different substrates using the test apparatus shown in FIG. 5.
Figure 6B:
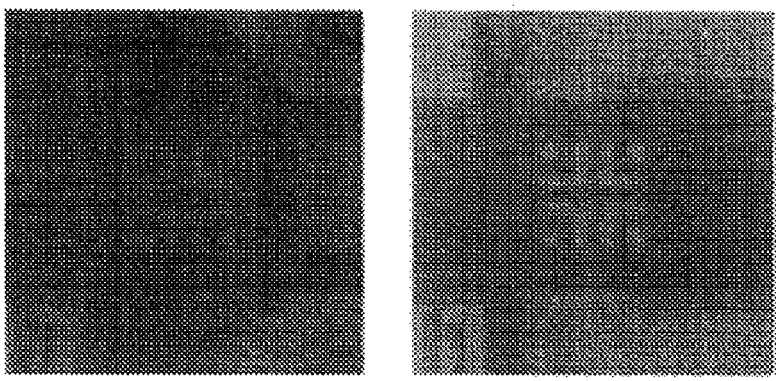

FIG. 6A and FIG. 6B show the images of two different substrates formed from light sources 50A and 50B, respectively, as detected by the detector 60. From a visual comparison of FIGS. 6A and 6B, it should be apparent that the transmissive front view approach produces an image (FIG. 6A) with far greater contrast than an image produced by the reflective back view approach (FIG. 6B). Also the reflective target images are dark with the transmissive front view approach and bright with the reflective back view approach.

This lack of image contrast with the reflective back view approach is a generally expected result since a substantial amount of contrast reducing glare is to be expected from the light reflected from the second silicon surface. Given the Hobson's choice of requiring a wavelength that is transmitted to some degree through a double thickness silicon wafer yet absorbed enough in a silicon detector to generate a useable signal, it is surprising that any sort of recognizable signal was obtained with the reflective back view approach.

Thus, conventional wisdom dictates that the detector 60 should be formed from a signal-generating material of a composition that is quite different from the composition of the wafer 10 to ensure an adequate image contrast, signal-to-noise ratio, and/or signal-to-background ratio. Otherwise, it may not be possible to recognize the alignment target with any measure of reliability or to achieve substrate alignment to a sufficient precision.

Figure 7:
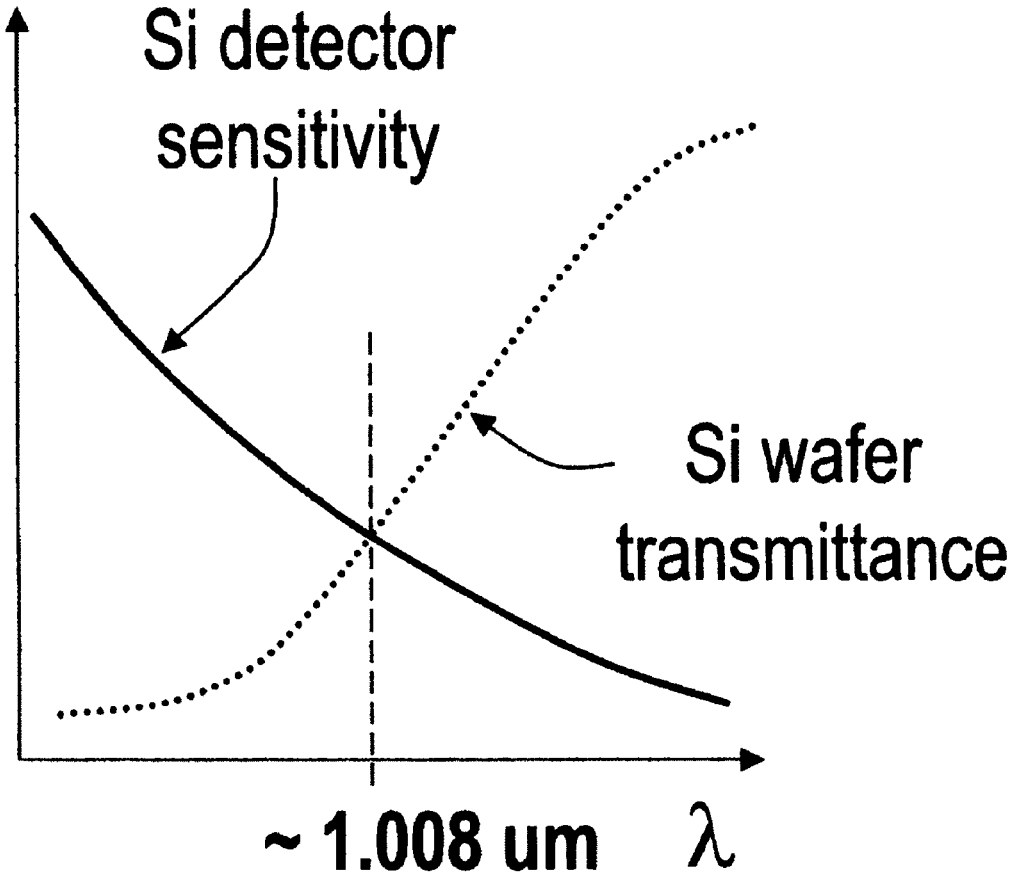
FIG. 7 shows a plot of relative silicon-based detector sensitivity and relative silicon wafer transmittance as a function of wavelength.

Upon more in-depth investigation, however, it has been discovered that a silicon-based detector may indeed be satisfactorily used to carry out silicon wafer alignment through the reflective back view approach. As shown in FIG. 7, silicon-based detector sensitivity is fairly high for light of visible wavelengths and decreases for light of infrared wavelengths. Also as shown in FIG. 7, silicon wafers are highly transmissive to light of infrared wavelengths, and fairly opaque to visible light. Notably, there exists a range of wavelengths of about 1.008 micrometers that represents an optimal range to carry out precise substrate alignment using the reflective back view approach for the particular experimental setup depicted in FIG. 5. At significantly longer wavelengths, the detector sensitivity is too low and the signal is overwhelmed by the glare from the wafer second surface. At significantly shorter wavelengths, the wafer is too opaque, which again results in the signal being overwhelmed by the glare from the wafer second surface.

In short, given the information contained in FIG. 7, the invention recognizes that the reflective back view approach for substrate alignment may be feasible even when the detector used to carry out the reflective back view approach employs a signal-generating material that is substantially identical in composition to the substrate. Feasibility, however, requires the use of light at or near the optimum wavelength, which occurs over a relatively narrow spectral region. The narrow spectral region depends on the characteristics of the detector and the transmission of the substrate material. For example, a thicker or thinner substrate may exhibit a transmission curve that is shifted down or up, respectively. In turn, the crossover point may shift higher or lower in wavelength. Thus, the crossover point, about which the optimal range is defined, may vary according the particulars of any embodiment of the invention.

Variations of the Invention

As discussed above, the invention generally relates to an approach to position a substrate containing one or more patterned layers so that it will be correctly situated to accept a subsequent exposure pattern. Positioning is done by employing a detector to view one or more substrate features or an alignment target, either of which may be located on or near the front-side or back side of the substrate. An important aspect of the invention involves the use of an optical detector that includes a signal-generating material common to the substrate material. However, the invention may be embodied in a variety of forms, including methods and apparatuses that may not require use of an optical detector that employs a signal-generating material that is substantially identical to the substrate material.

The invention is about viewing a reflective feature and obtaining an image with sufficient contrast so the feature can be reliably recognized and accurately located. The feature is viewed through a layer of material that is at least partially transparent to light of a selected wavelength. Light of the selected wavelength is directed through the layer toward the reflective feature, which redirects the light back through the layer where an image detector serves to intercept the light. The detector generates a signal with characteristics to allow a machine vision system to locate the boundaries of the feature to a desired precision.

As another exemplary embodiment, an apparatus is provided that includes a substrate as described above and its holder, a light source for generating light of the selected wavelength, an image detector, and a machine vision system in signal-receiving relation to the image detector. The light source is positioned to direct light of the selected wavelength through the substrate surface layer. The image detector is positioned to intercept light reflected by the reflective feature and is capable of generating from the intercepted light a sufficiently analyzable signal, i.e. the machine vision system is capable of recognizing the reflective feature and determining from the signal the position of the reflective feature with a degree of precision sufficient for substrate alignment.

Light of various wavelengths may be used, however the wavelength should be selected according to the construction and materials of the substrate to be aligned and the detector to receive the image. For example, light of an infrared wavelength, e.g., about 0.8 μm to about 1.1 μm may be used for silicon substrates. In some instances, substantially monochromatic light, contained in a spectral bandwidth of less than about 10 nm, may be used. LEDs, laser diodes, etc., are particularly suited for generating light in a narrow bandwidth. Filtering technologies known in the art may be used to determine the wavelength of light if a broad-band light source is used for illumination.

Similarly, a number of different types of optical detectors may be used as long as the signal generated is suitable for use in substrate alignment. For most integrated circuit applications the signal-to-background ratio must be sufficient to provide a target position precision of ±0.5 micrometers or less, e.g., mean plus three-sigma position accuracy of at least ±0.5 micrometers. In some instances, the signal-to background ratio may be the effective limitation in accurately determining the position of the reflective feature. In other cases the signal to noise ratio may prove to be the main limitation in determining the target position. In any case a minimum target signal-to-electrical noise ratio of at least 3:1 is typically required.

Substrate construction may vary. For example, the substrate may be a precursor to a light detector or image detector and the layer or layers through which light is to travel to reach the reflective target may have a thickness of about 50 micrometers to about 200 micrometers. However, light may be required to travel through a layer thickness of up to about 750 micrometers to about 1000 micrometers in some instances.

Furthermore, the substrate may include a plurality of layers, i.e., two, three, or more layers. When the substrate includes a first and a second layer, the reflective feature is interposed between the first and second layers. The first and second layers may include different materials. Optionally, one of the first and second layers may be thicker than the other.

Wafer holders suitable for use with the invention may have varying configurations or geometries. Exemplary support configurations include those having a three-pin support on which the wafer may rest as well as those in which a wafer is mounted vertically or horizontally. In some rare instances, the holder may allow a wafer to be held in a free-standing state, e.g., when the wafer in its natural state is flat. Alternatively, a chuck configuration may be used that renders a wafer nominally flat with a controlled force, e.g., applied through electrostatic charge or vacuum.

Additional variations of the present invention will be apparent to those of ordinary skill in the art in view of the disclosure contained herein. For example, the invention may be used to align a substrate feature relative to any of a plurality of other items. Such items may include, and not limited to, a reference position with respect to a projected reticle image. Computer systems may also be advantageously used to carry out aspects of the invention. Similarly, optical technologies known in the art may be used to convey light from the source to the target and from the reflective target to the detector. For example, the inventive apparatus may include lenses, beam splitters, prisms, light guides, and other items useful in the field of optics.

It is to be understood that, while the invention has been described in conjunction with the preferred specific embodiments thereof, the foregoing description merely illustrates and does not limit the scope of the invention. Numerous alternatives and equivalents exist which do not depart from the invention set forth above. For example, any particular embodiment of the invention may be modified to include or exclude features of other embodiments. Other aspects, advantages, and modifications within the scope of the invention will be apparent to those skilled in the art to which the invention pertains.

All patents, and patent applications mentioned herein are hereby incorporated by reference in their entireties to the extent not inconsistent with the description set forth above.

What is claimed is:

1. A method for positioning a substrate, comprising:

(a) holding a substrate having a first surface and a reflective feature at a position that is separated from the first surface by a first layer of material having at least partial transparency to light of a selected wavelength;

(b) directing light of the selected wavelength toward the reflective feature; and (c) using an optical image detector to intercept light reflected by the feature to generate a sufficiently analyzable image signal to allow a signal-analyzing system to recognize and to locate the position of the reflective feature with a degree of precision sufficient for substrate alignment, wherein the optical image detector comprises a signal-generating material that is substantially identical in composition to the first layer material.

2. The method of claim 1, wherein light of the selected wavelength is directed through the substrate first surface and the first layer toward the reflective feature, which, in turn reflects the light through the first layer and the first surface toward the optical image detector.

3. The method of claim 2, wherein the signal-analyzing system is a machine-vision system capable of recognizing the feature from the detector signal.

4. The method of claim 3, wherein the image signal exhibits a signal-to-background ratio that is sufficient to determine the position of the reflective feature to a precision of at least ±0.5 micrometers.

5. The method of claim 3, wherein the reflected light results in the image signal having a signal to electrical noise ratio of at least 3:1.

6. The method of claim 1, wherein the image signal-generating material of the optical image detector and the material of the first layer each consists essentially of silicon.

7. The method of claim 1, wherein the selected wavelength is contained in a spectral bandwidth of less than about 10 nm.

8. The method of claim 1, wherein the selected wavelength is an infrared wavelength.

9. The method of claim 8, wherein the selected wavelength is about 0.8 μm to about 1.1 μm.

10. The method of claim 1, wherein the substrate is a precursor to a light detector or image detector.

11. The method of claim 1, wherein the first layer has a thickness of about 50 micrometers to about 750 micrometers.

12. The method of claim 1, wherein the reflective feature is located at a second surface that opposes the first surface.

13. The method of claim 12, wherein the substrate further comprises a second layer and the reflective feature is interposed between the first and second layers.

14. The method of claim 13, wherein each of the first and second layers comprises a different material.

15. The method of claim 13, wherein the second layer exceeds the first layer in thickness.

16. An apparatus for positioning a substrate, comprising:

a substrate having a first surface and a reflective feature at a position that is separated from the first surface by a first layer of material having at least partial transparency to light of a selected wavelength;

a substrate holder holding the substrate;

a light source for generating light of the selected wavelength, wherein the light source is positioned to direct light of the selected wavelength to the reflective feature;

an optical image detector positioned to intercept light reflected by the reflective feature, wherein the image detector comprises a signal-generating material that is substantially identical in composition to the first layer material of the first layer and is capable of generating an image signal from the intercepted light; and a machine vision system in signal-receiving relation to the image detector, wherein the machine vision system is capable of analyzing the image signal to recognize the reflective feature and to determine the position of the reflective feature with a sufficient degree of precision.

17. The apparatus of claim 16, wherein the light source is positioned to direct light of the selected wavelength through the first surface of the substrate and first layer toward the reflective feature, and the optical image detector is positioned to intercept light reflected by the reflective feature through the first layer and the first surface toward the optical image detector.

18. The apparatus of claim 17, wherein the machine vision system has a capability to determine the position of the reflective feature to a precision of at least ±0.5 micrometers.

19. The apparatus of claim 17, wherein the selected wavelength produces an image signal that corresponds to the reflective feature and has a signal to electrical noise ratio of at least 3:1.

20. The apparatus of claim 16, wherein each of the signal-generating and first layer materials comprises silicon.

21. The apparatus of claim 20, wherein each of the signal-generating and first layer materials consists essentially of silicon.

22. The apparatus of claim 16, wherein the light of the selected wavelength is contained in a spectral bandwidth of less than about 10 nm.

23. The apparatus of claim 16, wherein the selected wavelength is an infrared wavelength.

24. The apparatus of claim 23, wherein the selected wavelength is about 0.8 μm to about 1.1 μm.

25. The apparatus of claim 16, wherein the substrate is a precursor to a light detector or an image detector.

26. The apparatus of claim 16, wherein the first layer has a thickness of about 50 micrometers to about 200 micrometers.

27. The apparatus of claim 16, wherein the reflective feature is located at a second surface that opposes the first surface.

28. The apparatus of claim 27, wherein the substrate further comprises a second layer and the reflective feature is interposed between the first and second layers.

29. The apparatus of claim 28, wherein each of the first and second layers comprises a different material.

30. The apparatus of claim 28, wherein the second layer exceeds the first layer in thickness.

31. A method for positioning a substrate, comprising:

(a) holding a substrate having a first surface and a feature at a position that is separated from the first surface by a first layer of material, wherein the material of the first layer has at least partial transparency to light of a selected wavelength and the feature has a transparency different from that of the material of the first layer;

(b) directing light of the selected wavelength through the substrate; and (c) using an optical image detector to intercept light transmitted through the substrate to generate a sufficiently analyzable image signal to allow a signal-analyzing system to recognize and locate the position of the reflective feature with a degree of precision sufficient for substrate alignment, wherein the optical image detector comprises a signal-generating material that is substantially identical in composition to the material of the first layer.

*32. A method for positioning a substrate, comprising:*

*(a) holding a substrate having a first surface and a reflective feature at a position that is separated from the first surface by a first layer of material having at least partial transparency to light of a selected wavelength;*

*(b) directing light of the selected wavelength toward the reflective feature; and*

*(c) using an optical image detector to intercept light reflected by the feature to generate a sufficiently analyzable image signal to allow a signal-analyzing system to recognize and to locate the position of the reflective feature with a degree of precision sufficient for substrate alignment,*

*wherein the optical image detector comprises a signal-generating material that has a signal to noise ratio of at least 3:1.*

*33. The method of claim 32, wherein light of the selected wavelength is directed through the substrate first surface and the first layer toward the reflective feature, which, in turn, reflects the light through the first layer and the first surface toward the optical image detector.*

*34. The method of claim 33, wherein the signal-analyzing system is a machine-vision system capable of recognizing the feature from the detector signal.*

*35. The method of claim 34, wherein the image signal exhibits a signal-to-background ratio that is sufficient to determine the position of the reflective feature to a precision of at least ±0.5 micrometers.*

*36. The method of claim 32, wherein the optical image detector is comprised of Si, Ge, SiC, GaAs, GaN or InP.*

*37. The method of claim 32, wherein the image signal-generating material of the optical image detector and the material of the first layer each consists of different materials.*

*38. The method of claim 32, wherein the material of the first layer consists of silicon and the image signal-generating material of the optical image detector consists of Ge, SiC, GaAs, GaN or InP.*

*39. The method of claim 32, wherein the selected wavelength is contained in a spectral bandwidth of less than about 10 nm.*

*40. The method of claim 32, wherein the selected wavelength is an infrared wavelength.*

*41. The method of claim 40, wherein the selected wavelength is about 0.8 μm to about 1.1 μm.*

*42. The method of claim 32, wherein the substrate is a precursor to a light detector or image detector.*

*43. The method of claim 32, wherein the first layer has a thickness of about 50 micrometers to about 750 micrometers.*

*44. The method of claim 32, wherein the reflective feature is located at a second surface that opposes the first surface.*

*45. The method of claim 44, wherein the substrate further comprises a second layer and the reflective feature is interposed between the first and second layers.*

*46. The method of claim 45, wherein each of the first and second layers comprises a different material.*

*47. The method of claim 45, wherein the second layer exceeds the first layer in thickness.*

*48. An apparatus for positioning a substrate, comprising:*

*a substrate having a first surface and a reflective feature at a position that is separated from the first surface by a first layer of material having at least partial transparency to light of a selected wavelength;*

*a substrate holder holding the substrate;*

*a light source for generating light of the selected wavelength, wherein the light source is positioned to direct light of the selected wavelength to the reflective feature;*

*an optical image detector positioned to intercept light reflected by the reflective feature, wherein the image detector comprises a signal-generating material that has a signal to noise ratio of at least 3:1 and is capable of generating an image signal from the intercepted light; and*

*a machine vision system in signal-receiving relation to the image detector,*

*wherein the machine vision system is capable of analyzing the image signal to recognize the reflective feature and to determine the position of the reflective feature with a sufficient degree of precision.*

*49. The apparatus of claim 48, wherein the light source is positioned to direct light of the selected wavelength through the first surface of the substrate and first layer toward the reflective feature, and the optical image detector is positioned to intercept light reflected by the reflective feature through the first layer and the first surface toward the optical image detector.*

*50. The apparatus of claim 49, wherein the machine vision system has a capability to determine the position of the reflective feature to a precision of at least ±0.5 micrometers.*

*51. The apparatus of claim 49, wherein the selected wavelength produces an image signal that corresponds to the reflective feature.*

*52. The apparatus of claim 48 wherein the optical image detector is comprised of one of Si, Ge, SiC, GaAs, GaN or InP.*

*53. The apparatus of claim 48, wherein each of the signal generating and first layer materials comprise a different material.*

*54. The apparatus of claim 48, wherein each of the signal-generating and first layer materials each consists essentially of silicon.*

*55. The apparatus of claim 52 wherein the first layer material consists of Si.*

*56. The apparatus of claim 48, wherein the light of the selected wavelength is contained in a spectral bandwidth of less than about 10 nm.*

*57. The apparatus of claim 48, wherein the selected wavelength is an infrared wavelength.*

*58. The apparatus of claim 57, wherein the selected wavelength is about 0.8 μm to about 1.1 μm.*

*59. The apparatus of claim 48, wherein the substrate is a precursor to a light detector or an image detector.*

*60. The apparatus of claim 48, wherein the first layer has a thickness of about 50 micrometers to about 200 micrometers.*

*61. The apparatus of claim 48, wherein the reflective feature is located at a second surface that opposes the first surface.*

*62. The apparatus of claim 61, wherein the substrate further comprises a second layer and the reflective feature is interposed between the first and second layers.*

*63. The apparatus of claim 62, wherein the second layer exceeds the first layer in thickness.*

*64. A method for positioning a substrate, comprising:*

*(a) holding a substrate having a first surface and a feature at a position that is separated from the first surface by a first layer of material, wherein the material of the first layer has at least partial transparency to light of a selected wavelength and the feature has a transparency different from that of the material of the first layer;*

*(b) directing light of the selected wavelength through the substrate; and*

*(c) using an optical image detector to intercept light transmitted through the substrate to generate a sufficiently analyzable image signal to allow a signal-analyzing system to recognize and locate the position of the reflective feature with a degree of precision sufficient for substrate alignment,*

*wherein the optical image detector comprises a signal-generating material that has a composition that is different from the material of the first layer.*

*65. A method as in claim 64 wherein the material of the first layer is Si and the signal generating material is one of Ge, SiC, GaAs, GaN or InP.*

* * * * *